United States Patent
Notani

(10) Patent No.: US 6,559,708 B2
(45) Date of Patent: May 6, 2003

(54) VIRTUAL AND BACKGATE SUPPLY LINE CIRCUIT

(75) Inventor: Hiromi Notani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/758,360

(22) Filed: Jan. 12, 2001

(65) Prior Publication Data

US 2001/0013806 A1 Aug. 16, 2001

(30) Foreign Application Priority Data

Feb. 15, 2000 (JP) ..................................... 2000-036616

(51) Int. Cl.$^7$ ................................................. G05F 3/02
(52) U.S. Cl. ...................................... 327/537; 327/534
(58) Field of Search .................................. 327/534, 537

(56) References Cited

U.S. PATENT DOCUMENTS

| | | | |
|---|---|---|---|
| 5,689,209 A | * 11/1997 | Williams et al. | 327/425 |
| 5,821,796 A | * 10/1998 | Yaklin et al. | 326/57 |
| 5,966,038 A | * 10/1999 | Langer | 327/313 |
| 6,107,836 A | * 8/2000 | Kawahara et al. | 326/102 |
| 6,218,895 B1 | * 4/2001 | De et al. | 327/566 |
| 6,242,948 B1 | 6/2001 | Makino | |
| 6,285,213 B1 | * 9/2001 | Makino | 326/81 |

FOREIGN PATENT DOCUMENTS

| | | |
|---|---|---|
| JP | 7-212217 | 8/1995 |
| JP | 8-321763 | 12/1996 |
| JP | 9-64715 | 3/1997 |
| JP | 11-150193 | 6/1999 |

OTHER PUBLICATIONS

Hiroshi Makino et al., "An Auto–Backgate–Controlled MT–CMOS Circuit", 1998 Symposium on VLSI Circuits Digest of Technical Papers, pp 42–43, 1988 IEEE.

* cited by examiner

Primary Examiner—Terry D. Cunningham
(74) Attorney, Agent, or Firm—Burns, Doane, Swecker & Mathis, LLP

(57) ABSTRACT

A semiconductor integrated circuit includes: a first MOS transistor having one source/drain electrode for receiving a power supply voltage and the other source/drain electrode connected to a virtual power supply line; a second MOS transistor having one source/drain electrode connected to the virtual power supply line and the other source/drain electrode connected to a backgate power supply line; and a third MOS transistor having one source/drain electrode connected to the virtual power supply line and the backgate electrode connected to the backgate power supply line. When the first and second transistors are turned on, a voltage of the backgate electrode is forwardly biased to the one source/drain electrode in the third MOS transistor, thereby improving the operation speed of an internal circuit including the third MOS transistors in an active period.

23 Claims, 8 Drawing Sheets

VIRTUAL AND BACKGATE SUPPLY LINE CIRCUIT

BACKGROUND OF THE INVENTION

1. Field of the Invention

The present invention relates to a semiconductor integrated circuit intended to reduce its power dissipation by controlling power supplies to an internal circuit in response to active and sleep periods of the internal circuit.

2. Description of the Prior Art

Recent developments in portable or mobile equipment have caused requirements of low power consumption semiconductor integrated circuits. For example, as shown in JP-A 7/212218, it has been proposed to provide a semiconductor integrated circuit with a power supply switch in which a power supply to an internal circuit is provided in an active period to operate the internal circuit, while the power supply to the internal circuit is stopped in a sleep period which don't have to operate the internal circuit, e.g. in no operation by users. Particularly, by employing a MTCMOS (Multi-threshold CMOS) in which a threshold voltage of transistors constituting the power supply switch is larger than that of transistors constituting an internal circuit, the internal circuit which can operate by a low voltage power supply is achieved and leakage currents at the sleep period may be decreased.

As to the MTCMOS, a semiconductor further improved is described in JP-A 11/214962.

FIG. 11 illustrates a first semiconductor integrated circuit disclosed in JP-A 11/214962. The first semiconductor integrated circuit includes: a p-channel field effect transistor (hereinafter, referred to as pMOS transistor) QA1 as a power supply switch which is connected between a power supply line VDD and a virtual power supply line VA1; a n-channel field effect transistor (hereinafter, referred to as nMOS transistor) QB1 as a power supply switch which is connected between a power supply line GND and a virtual power supply line VB1; a diode D1 which is connected between the power supply line VDD and the virtual power supply line VA1; and a diode D2 which is connected between the power supply line GND and the virtual power supply line VB1. An internal circuit is connected between the virtual power supply lines VA1, VB1 which feed power supplies for operation. The internal circuit includes pMOS transistors Q3, Q4 and nMOS transistors Q5, Q6 each of which has an absolute value of the threshold voltage smaller than that of each of the transistors QA1, QB1.

The power supply line is applied with a voltage having a low voltage value LVDD around 1.0 V in an active period which operates the internal circuit and a voltage having a high voltage value HVDD of 3.3 V in a sleep period which does not use the internal circuit. The transistors QA1, QB1 are controlled by control signals CS1, CSB1 so as to be turned on simultaneously when the internal circuit is in the active period and turned off simultaneously when in the sleep period.

When the internal circuit is especially in the sleep period, each of the transistors Q3–Q6 is reversely biased to the source in a direction to increase the absolute value of the threshold voltage by the diodes D1, D2. When the internal circuit includes a sequential circuit such as a latch circuit, data latched in the sequential circuit in the active period may be latched without losses of the data in the sleep period, and a leakage current in the sleep period may be controlled.

FIG. 12 illustrates a second semiconductor integrated circuit disclosed in JP-A 11/214962. As only a part different from FIG. 11 is described, the second semiconductor integrated circuit includes: a pMOS transistor QA2, connected between a power supply line VDD1 and a backgate power supply line VA2, to be turned on/off simultaneously with a transistor QA1; and a pMOS transistor QA3, connected between a backgate power supply line VA2 and a power supply line VDD2, to be turned on/off complementarily with the transistor QA1. A diode D1 is connected between a virtual power supply line VA1 and the backgate power supply line VA2. A voltage having a voltage value LVDD is applied to the power supply line VDD1, while a voltage having a voltage value HVDD higher than the voltage value LVDD is applied to the power supply line VDD2. This second semiconductor integrated circuit also results in the above effect.

In the semiconductor integrated circuit as shown in FIG. 11, the virtual power supply line VA1 ideally becomes a potential level, which is equal to the power supply line VDD, in an active period of an internal circuit. However, in reality, a voltage drop is caused by a wiring resistance of the power supply line VDD, an ON-state resistance of the transistor QA1, and so on, and the voltage of the virtual power supply line VA1 becomes a value of (LVDD−ΔVA1). On the other hand, the backgate potential of the transistors Q3, Q4 is LVDD. Since each backgate potential of the transistors Q3, Q4 is higher than the corresponding source potential, the operations of the transistors Q3, Q4 are made slower by an increase of the absolute values of the threshold voltages of these transistors Q3, Q4. In reality, the voltage of the virtual power supply line VB1 also becomes a value of ΔVB1 higher than 0 V by a wiring resistance of the power supply line GND, an ON-state resistance of the transistor QB1, and soon. Since each backgate potential of the transistors Q5, Q6 is made lower than that of the corresponding source, the operations of the transistors Q5, Q6 are made slower by an increase of the absolute values of the threshold voltages of the transistors Q5, Q6. Thus, the operation speed of the internal circuit deteriorates.

On the other hand, in the semiconductor integrated circuit illustrated in FIG. 12, in an active period, as described above, the wiring resistance and the ON-state resistance of the transistors QA1, QA2 cause voltage drops of the virtual power supply lines VA1, VA2 from an LVDD value to (LVDD−ΔVA1), (LVDD−ΔVA2), respectively. Additionally, at this time, the voltage drop of the virtual power supply line VA1 is remarkably greater than that of the backgate power supply line VA2, establishing the relationship of ΔVA1>>ΔVA2. This is because the leakage current caused from the backgate power supply line VA2 to the transistors Q3, Q4 via the backgate is negligibly smaller than the active current from the virtual power supply line VA1 to the VB1 because of the operation of the internal circuit. The backgate potential is higher than that of each source of the transistors Q3, Q4, and the operations of the transistors Q3, Q4 are still made slower.

SUMMARY OF THE INVENTION

Therefore, it is an object of the present invention is to provide a semiconductor integrated circuit which achieves reduced power dissipation in the general circuit while suppressing a performance deterioration of an internal circuit in an active period. A semiconductor integrated circuit of the present invention comprises: a first field effect transistor including one source/drain electrode for receiving as a first power supply voltage, the other source/drain electrode connected to the first virtual power supply line, and a gate electrode for receiving a control signal so as to control ON/OFF of the transistor; a second field effect transistor, having one source/drain electrode connected to the first virtual power supply line and the other source/drain electrode connected to the first backgate power supply line, to be turned on when the first field effect transistor is turned on; and a third field effect transistor having one source/drain electrode connected to the first virtual power supply line and a backgate electrode connected to the first backgate power supply line, and which constructs an internal circuit. This causes a voltage drop to the first virtual power supply line on the first power supply line because of an ON-state resistance of the first field effect transistor and so on. Its forward bias state reduces the absolute value of the threshold voltage of the third field effect transistor by the voltage drop, thereby speeding up a current supply operation of the third field effect transistor. Therefore, an operation speed of the internal circuit constructed by the third field effect transistor may be improved.

When the third field effect transistor is p-channel type, the semiconductor integrated circuit further comprises: a fourth field effect transistor having one source/drain electrode for receiving a high power supply voltage, the other source/drain electrode connected to the first backgate power supply line, and a gate electrode for receiving a control signal so as to be turned on complimentarily with the first field effect transistor; and a potential generation circuit, connected to the first virtual power supply line, for generating a potential smaller than that of the first backgate power supply line on the first virtual power supply line when the first field effect transistor is turned off. In addition, the second field effect transistor has a gate electrode for receiving a control signal so as to be turned on complimentarily with the fourth field effect transistor. Thus, when the first field effect transistor is turned off, since the potential of the backgate electrode to one source/drain electrode of the third field effect transistor is enhanced, a leakage current of the third field effect transistor constructing the internal circuit is reduced, resulting in achieving a reduced power dissipation in the general circuit.

In this case, the backgate electrode of the first field effect transistor may be connected to the first backgate electrode line, and the backgate electrode of the second FET also connected to the first backgate electrode line.

Further, when the third field effect transistor is set to p-channel type, the semiconductor integrated circuit includes a common first power supply line, connected to one source/drain electrode of the first field effect transistor and one source/drain electrode of the fourth field effect transistor, in which the first voltage is supplied as the first and second power supply voltages when the first field effect transistor is turned on, and the second voltage having a voltage value higher than the first voltage is supplied as the first and second power supply voltages when the first field effect transistor is turned off. In this case, the backgate of the first, second, and fourth field effect transistors may be connected to the first backgate power supply line. However, supplies of the first and second voltages to the first power supply line may be performed by a voltage switching circuit.

On the other hand, the semiconductor integrated circuit comprises: a first high power supply line for supplying a first voltage as a high power supply voltage to one source/drain electrode of the first field effect transistor; and a second high power supply line for supplying a second voltage having a voltage value higher than that of the first voltage as the high power supply voltage to one source/drain electrode of the fourth field effect transistor. The first and second voltages are supplied to the first and fourth field effect transistors simultaneously. In this case, the backgate electrodes of the first and second field effect transistors may be connected to the first backgate electrode line.

When the third field effect transistor constructing the internal circuit is n-channel type, the semiconductor integrated circuit of the present invention comprises: a fourth field effect transistor having one source/drain electrode for receiving the low power supply voltage, the other source/drain electrode connected to the first backgate power supply line, and a gate electrode for receiving a control signal so as to be turned on complimentarily with the first field effect transistor; and a first potential generation circuit, connected to the first virtual power supply line, for generating a potential larger than that of the first backgate power supply line on the first virtual power supply line when the first field effect transistor is turned off. When the first field effect transistor is turned off, the potential of the backgate electrode to the one source/drain electrode of the third field effect transistor is lowered, thereby reducing a leakage current of the third field effect transistor constructing the internal circuit and achieving a reduced power dissipation of the general circuit. In this case, the backgate electrodes of the first, second and fourth transistors may be connected to the first backgate power supply line.

The semiconductor integrated circuit of the present invention comprises: a fifth field effect transistor having one source/drain electrode connected to a second power supply line, the other source/drain electrode connected to a second virtual power supply line, a gate electrode for receiving a control signal so as to control ON/OFF of the transistor, and a backgate electrode connected to said second power supply line; and a sixth field effect transistor, having one source/drain electrode connected to the second virtual power supply line and a backgate electrode connected to the second power supply line, which is different in conductance type from the third field effect transistor and which constructs an internal circuit of CMOS type with the third field effect transistor. In this case, when the semiconductor integrated circuit is formed on a semiconductor substrate of conductive type reverse to the sixth field effect transistor, it is not required to employ a so-called triple well structure in the substrate.

Here, the aforementioned semiconductor integrated circuit may comprise: a potential generation circuit, connected to the second virtual power supply line, for generating a potential difference between the power supply line and the second virtual power supply line when the fifth field effect transistor is turned off.

The potential generation circuit may include a construction such that one field effect transistor or a plurality of field effect transistors connected in series are connected between the first power supply line and the second virtual power supply line.

The potential generation circuit may include a construction such that one diode or a plurality of diodes connected in series are connected between the backgate power supply line and the first virtual power supply line.

The potential generation circuit may include a construction such that one field effect transistor or a plurality of field effect transistors connected in series are connected between the backgate power supply line and the first virtual power supply line, and the gate electrode and one source/drain electrode of each field effect transistor in the first potential generation circuit may be connected to each other.

The potential generation circuit may include a construction such that one diode or a plurality of diodes connected in series are connected between the first power supply line and the second virtual power supply line.

The potential generation circuit may include a construction such that one field effect transistor or a plurality of field effect transistors connected in series are connected between the first power supply line and the second virtual power supply line, and the gate electrode and one source/drain electrode of each field effect transistor in the potential generation circuit may be connected to each other.

The backgate electrodes of the first, second, and fourth field effect transistors may be connected to said first backgate power supply line.

Further, the semiconductor integrated circuit may comprise: a fourth field effect transistor having one source/drain electrode for receiving a second power supply voltage, the other source/drain electrode connected to the first backgate power supply line, and a gate electrode for receiving a control signal so as to be turned on complimentarily with the first field effect transistor; and a potential generating circuit connected to the first virtual power supply line, for generating a potential difference between the first backgate power supply line and said first virtual power supply line when the first field effect transistor is turned off, wherein the second field effect transistor has a gate electrode for receiving a control signal so as to be turned on complimentarily with the fourth field effect transistor.

Here, the first power supply voltage has a first voltage value when the first field effect transistor is turned on, and the second power supply voltage has a second voltage value different from the first voltage value when the first field effect transistor is turned off.

Furthermore, at least either of backgate electrodes of the first field effect transistor and the second field effect transistor may be connected to said first backgate power supply line.

DETAILED DESCRIPTION OF THE PREFERRED EMBODIMENTS

Figure 1:
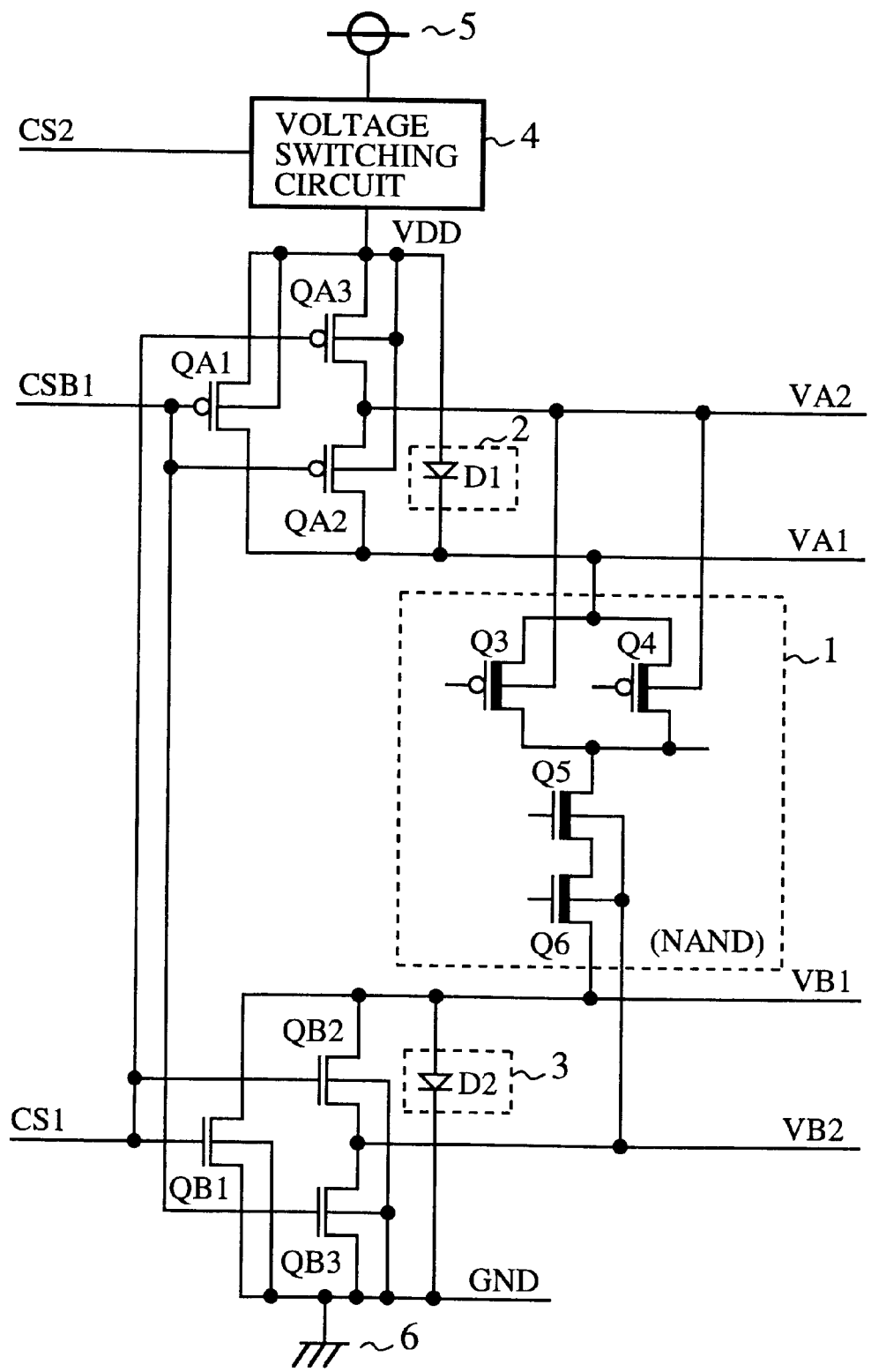
FIG. 1 is a schematic circuit diagram showing a semiconductor integrated circuit according to a first embodiment of the present invention.

The invention will now be described with reference to the accompanying drawings. In the drawings, the same or corresponding parts are denoted with the same numerals.

First Embodiment

Referring next to FIG. 1, there is illustrated a circuit diagram showing a semiconductor integrated circuit according to a first embodiment of the present invention. This semiconductor integrated circuit includes a power supply line VDD which supplies as a high power supply voltage either of a first voltage and a second voltage having a voltage value higher than the first voltage, a power supply line GND for supplying a low power supply voltage, virtual power supply lines VA1, VB1, backgate power supply lines VA2, VB2, an internal circuit 1, potential generation circuits 2, 3, a voltage switching circuit 4, and pMOS transistors QA1, QA2, QA3 and nMOS transistors QB1, QB2, QB3 each of which serves as a power supply switch.

In the pMOS transistor QA1, one source/drain electrode is connected to the power supply line VDD, the other source/drain electrode is connected to the virtual power supply line VA1, the backgate electrode is connected to the power supply line VDD, and a control signal CSB1 is supplied to the gate electrode.

In the pMOS transistor QA2, one source/drain electrode is connected to the virtual power supply line VA1, the other source/drain electrode is connected to the backgate power supply line VA2, the backgate electrode is connected to the power supply line VDD, and the control signal CSB1 is supplied to the gate electrode.

In the pMOS transistor QA3, one source/drain electrode is connected to the power supply line VDD, the other source/drain electrode is connected to the backgate power supply line VA2, the backgate electrode is connected to the power supply line VDD, and a control signal CS1 is supplied to the gate electrode.

The potential generation circuit 2 is connected to the power supply line VDD and the virtual power supply line VA1, and a potential smaller than that of the power supply line VDD is supplied to the virtual power supply line VA1. The potential generation circuit 2 includes a diode D1 in which the anode and the cathode are connected to the power supply line VDD and the virtual power supply line VA1, respectively.

In the nMOS transistor QB1, one source/drain electrode is connected to the power supply line GND, the other source/drain electrode is connected to the virtual power supply line VB1, the backgate electrode is connected to the power supply line GND, and the control signal CS1 is supplied to the gate electrode.

In the nMOS transistor QB2, one source/drain electrode is connected to the virtual power supply line VB1, the other source/drain electrode is connected to the backgate power supply line VB2, the backgate electrode is connected to the power supply line GND, and the control signal CS1 is supplied to the gate electrode.

In the nMOS transistor QB3, one source/drain electrode is connected to the power supply line GND, the other source/drain electrode is connected to the backgate power supply line VB2, the backgate electrode is connected to the power supply line GND, and the control signal CSB1 is supplied to the gate electrode.

The potential generation circuit 3 is connected to the power supply line GND and the virtual power supply line VB1, and supplies a potential greater than that of the power supply line GND to the virtual power supply line VB1. The potential generation circuit 3 includes a diode D2 in which the anode and the cathode are connected to the virtual power supply line VB1 and the power supply line GND, respectively.

The internal circuit 1 is a logic circuit having a CMOS structure in which voltages of the virtual power supply lines VA1, VB2 operates as power sources. In each pMOS transistor of the internal circuit 1, the backgate electrode is connected to the backgate power supply line VA2, and one source/drain electrode is connected to the virtual power supply line VA1 directly or via another pMOS transistor. Similarly, in each nMOS transistor of the internal circuit 1, the backgate electrode is connected to the backgate power supply line VB2, and one source/drain electrode is connected to the virtual power supply line VB1 directly or via another nMOS transistor. As an example of the internal circuit 1, FIG. 1 shows a NAND circuit composed of two pMOS transistors Q3, Q4 and two nMOS transistors Q5, Q6.

The pMOS transistors Q3, Q4 are formed on a semiconductor substrate so that the absolute values of the threshold voltages of the pMOS transistors Q3, Q4 may be smaller than those of the pMOS transistors QA1 to QA3. The nMOS transistors Q5, Q6 are formed on the semiconductor substrate so that the absolute values of the threshold voltages of the nMOS transistors Q5, Q6 may be smaller than those of the nMOS transistors QB1 to QB3.

The control signals CS1, CSB1 are generated from a control circuit (not depicted) in the semiconductor integrated circuit, and are signals that designate which of the active and sleep states the internal circuit 1 is, and that have logic levels inverted to each other. In the active state, the control signals CS1, CSB1 designate H level and L level, respectively, while in the sleep state, the control signals designate L level and H level, respectively. Thus, in the active state, while both the pMOS transistors QA1, QA2 and the nMOS transistors QB1, QB2 are turned on, both the pMOS transistor QA3 and the nMOS transistor QB3 are turned off. On the other hand, in the sleep state, the transistors QA1–QA3, QB1–QB3 each have the conductive state inverted to the above description.

The voltage switching circuit 4, for example, constructed by a DC-DC converter (voltage converter), receives a low voltage LVDD as the first voltage from an external power supply pin 5, and supplies the low voltage LVDD to the power supply line VDD when the internal circuit 1 is in the active state, or supplies the high voltage HVDD to the power supply line VDD after the low voltage LVDD is converted to the high voltage HVDD when the internal circuit 1 is in the sleep state, in response to the control signal CS2. The high voltage HVDD as the second voltage has a voltage value higher than the low voltage LVDD. Here, 1.0 V and 3.3 V are employed as the voltages LVDD, HVDD, respectively.

On the other hand, a ground potential as a low power supply voltage or a third power supply voltage, i.e. 0 V, is supplied to the power supply line GND via a ground pin 6.

Figure 2:
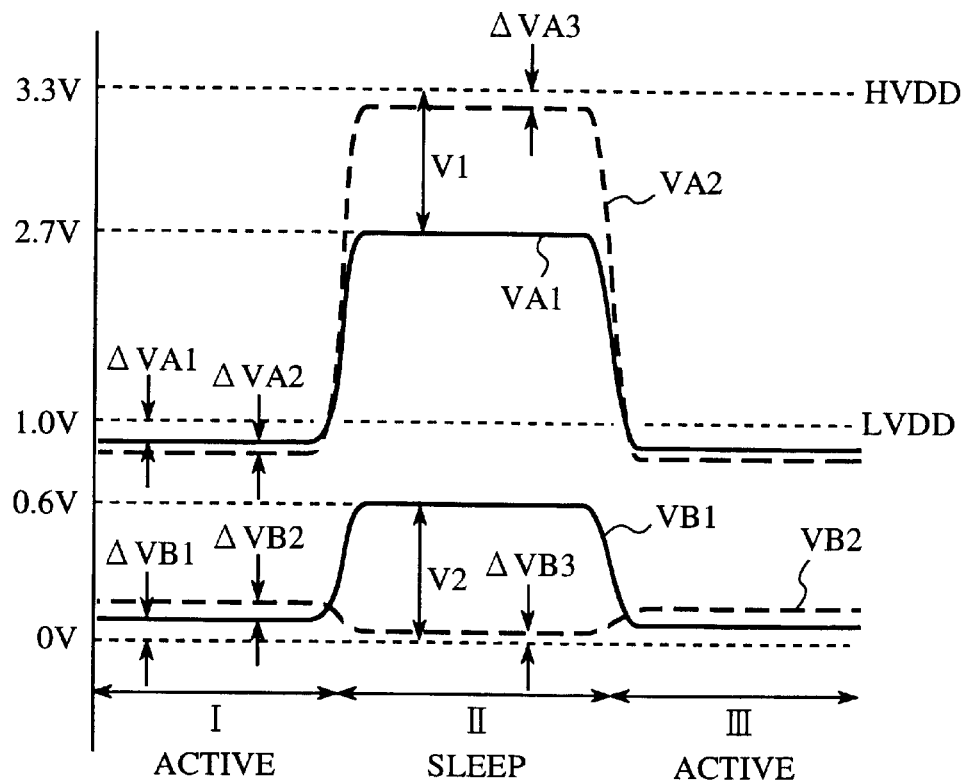
FIG. 2 is a timing chart showing a transition of each potential of virtual power supply lines VA1, VB1 and backgate power supply lines VA2, VB2 in the semiconductor integrated circuit of FIG. 1.

Referring to a timing chart as shown in FIG. 2, the operation of the semiconductor integrated circuit will be next described. In FIG. 2, two solid lines designate time transitions of voltage values with respect to the virtual power supply lines VA1, VB1, and two dotted lines designate time transitions of voltage values with respect to the backgate power supply lines VA2, VB2.

In a first period I corresponding to an active state, the low voltage LVDD is supplied to the power supply line VDD via the voltage switching circuit 4, and the pMOS transistor QA1 and the nMOS transistor QB1 are turned on simultaneously in response to the control signals CS1, CSB1, and supply voltages to the virtual power supply line VA1, VB1. When the pMOS transistor QA1 is turned on, the pMOS transistor QA2 is turned on, while the pMOS transistor QB3 is turned off. Similarly, when the nMOS transistor QB1 is turned on, the nMOS transistor QB2 is turned on, while the nMOS transistor QB3 is turned off.

Voltages (LVDD−ΔVA1) and ΔVB1 are supplied to the virtual power supply lines VA1, VB1. As mentioned above, the voltage of the virtual power supply line VA1 drops from the power supply line VDD by ΔVA1, caused by an ON-state resistance of the pMOS transistor QA1 and so on. Similarly, the voltage of the virtual power supply line VB1 rises from the power supply line GND by ΔVB1, caused by an ON-state resistance of the nMOS transistor QB1 and so on. The internal circuit 1 activates voltages supplied to the virtual power supply lines VA1, VB1 as a power source, and executes a given function such as NAND logic calculation.

Additionally, a further voltage drop of the backgate power supply line VA2 to the voltage of the virtual power supply line VA1 is caused due to an ON-state resistance of the pMOS transistor QA2. When the amount of the voltage drop is set to ΔVA2, the backgate power supply line VA2 has a voltage of (LVDD−ΔVA1−ΔVA2). Note that ΔVA1 is a larger value than ΔVA2 because of an active current generated from the virtual power supply line VA1 to the internal circuit 1.

In each of the pMOS transistors Q3, Q4 of the internal circuit 1, the backgate potential to the source potential is lowered by ΔVA2, and the absolute values of the threshold voltages of the transistors Q3, Q4 are reduced due to the forward bias state. Thus, current supply ability of the transistors Q3, Q4 may be improved.

Similarly, there occurs the voltage enhancement of the backgate power line VB2 to the voltage of the virtual power supply line VB1 because of an ON-state resistance of the nMOS transistor QB2 and so on. When the amount of the voltage enhancement is set to ΔVB2, the backgate power supply line VB2 has a voltage value of (ΔVB1+ΔVB2). Note that ΔVB1 is a larger value than ΔVB2 because of an active current generated from the internal circuit 1 to the virtual power supply line VB1. Thus, in each of the nMOS transistors Q5, Q6 of the internal circuit 1, the backgate potential to the source potential is raised by ΔVB2, and the absolute values of the threshold voltages are reduced due to the forward bias state. Thus, current supply ability of the transistors Q5, Q6 may be improved.

As described above, a high speed operation of the transistors Q3–Q6 may improve an operation speed of the internal circuit 1 in the active period.

Note that each of ΔVA1, ΔVA2, ΔVB1, ΔVB2 has a very small voltage value, and that no parasitic bipolar transistor conducts due to the forward bias state of the transistors Q3–Q6.

The active state is switched to the sleep state in response to the control signals CS1, CSB1. In a second period II corresponding to the sleep state, the high voltage HVDD is supplied from the voltage switching circuit 4 to the power supply line VDD, and both the pMOS transistors QA1, QA2 are turned off, while the pMOS transistor QA3 is turned on, in response to the control signals CS1, CSB1. At this time, there occurs a voltage drop of the backgate power supply line VA2 to the power supply line VDD because of an ON-state resistance of the pMOS transistor QA3 and so on, and a voltage of (HVDD−ΔVA3) is applied to the backgate power supply line VA2 via the pMOS transistor QA3. ΔVA3 is the amount of the voltage drop, substantially equal to ΔVA2 and smaller than ΔVA1. In addition, since the diode D1 is biased in the forward direction, there occurs a voltage drop from the power supply line VDD to the virtual power supply line VA1 by the threshold voltage of the diode D1. As a result, a voltage of (HVDD−V1) is supplied to the virtual power supply line VA1. Here, V1 is about 0.6 V.

The amount of the voltage drop caused by the pMOS transistor QA3 and the like is very slight as compared to the amount of the voltage drop caused by the diode D1, which establishes the relationship of (HVDD−ΔVA3)>(HVDD−V1). Thus, in the pMOS transistors Q3, Q4, the backgate potential to the source potential is enhanced by (V1−ΔVA3), and the absolute values of the threshold voltages is made larger due to the reverse bias state. As a result, a leakage current caused in the transistors Q3, Q4 during the sleep period may be reduced.

In addition, in the sleep state, both the nMOS transistors QB1, QB2 are turned off, while the nMOS transistor QB3 is turned on. There occurs a voltage enhancement of the backgate power supply line VB2 to the power supply line GND because of an ON-state resistance of the nMOS transistor QB3 and so on, and a voltage of ΔVB3 is supplied to the backgate power supply line VB2 via the nMOS transistor QB3. ΔVB3 is the amount of the voltage enhancement, substantially equal to ΔVB2 and smaller than ΔVB1. In addition, the diode D2 is biased in the forward direction. There occurs a voltage drop from the virtual power supply line VB1 to the power supply line GND by the threshold voltage of the diode D2. As a result, a voltage of V2 is supplied to the virtual power supply line VB1. Here, V2 is about 0.6 V as well.

The amount of the voltage drop caused by the nMOS transistor QB3 and the like is very slight as compared to the amount of the voltage drop caused by the diode D2, which establishes the relationship of V2>ΔVB3. Thus, in the nMOS transistors Q5, Q6, the backgate potential to the source potential is enhanced by (V2−ΔVB3), and the absolute values of the threshold voltages become large due to the reverse bias state. As a result, a leakage current caused in the transistors Q5, Q6 during the sleep period may be reduced.

Figure 3:
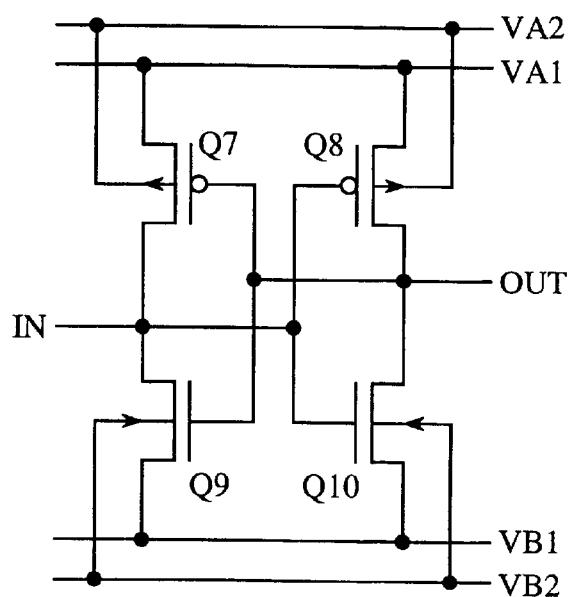
FIG. 3 is a schematic circuit diagram showing another example of an internal circuit 1.

In particular, when the internal circuit 1 has a sequential circuit capable of holding data such as latch circuit, there occurs a voltage of (HVDD−V1−V2) between the virtual power supply lines VA1, VB1 during the sleep period. Accordingly, even in the sleep period, no sequential circuit loses the data held upon completion of the active period due to that voltage. FIG. 3 illustrates a circuit diagram of the internal circuit 1 in the case of employing a latch circuit.

In a third period III which goes back in the active state again, the low voltage LVDD is supplied to the power supply line VDD, and the same voltage as that of the first period I is supplied to the virtual power supply lines VA1, VB1, and backgate power supply line VA2, VB2.

Additionally, even when one or both of the backgate electrodes of the pMOS transistors QA1, QA2 are not connected to the power supply line VDD, but to the backgate power supply line VA2, the same effect may be obtained. At this time, on the conductance of the pMOS transistors QA1, QA2, they are forwardly biased from the source/drain electrodes to the backgate electrode. However, there does not occur a potential difference such that the source/drain electrodes and the backgate electrode are electrically conducted.

Further, even when one or both of the backgate electrodes of the nMOS transistors QB1, QB2 are not connected to the power supply line GND, but to the backgate power supply line VB2, the same effect is obtained. At this time, also on the conductance of the nMOS transistors QB1, QB2, they are forwardly biased from the source/drain electrodes to the backgate electrode. However, there does not occur a potential difference such that the source/drain electrodes and the backgate electrode are electrically conducted.

The backgate electrode of the pMOS transistor QA3 may be connected to the backgate power supply line VA2 together with the backgate electrodes of the pMOS transistors QA1, QA2. The pMOS transistors QA1, QA2, QA3, Q3, Q4 are constructed in a common n-type semiconductor layer such as n-well.

Similarly, the backgate electrode of the nMOS transistor QB3 also may be connected to the backgate power supply line VB2 together with the backgate electrodes of the nMOS transistor QB1, QB2. The nMOS transistors QB1, QB2, QB3, Q5, Q6 are constructed in a common p-type semiconductor layer such as p-well.

Further, the potential generation circuit 2 may be connected to the backgate power supply line VA2 instead of the power supply line VDD. Similarly, the potential generation circuit 3 may be connected to the backgate power supply line VB2 instead of the power supply line GND.

When the power supply pin 5 is applied externally with a voltage of HVDD, the voltage switching circuit 4 is constructed such that the high voltage HVDD is converted to the low voltage LVDD to be supplied to the power supply line VDD during the active state of the internal circuit 1, and that the high voltage HVDD intact is supplied to the power supply line VDD during the sleep state.

Second Embodiment

Figure 4:
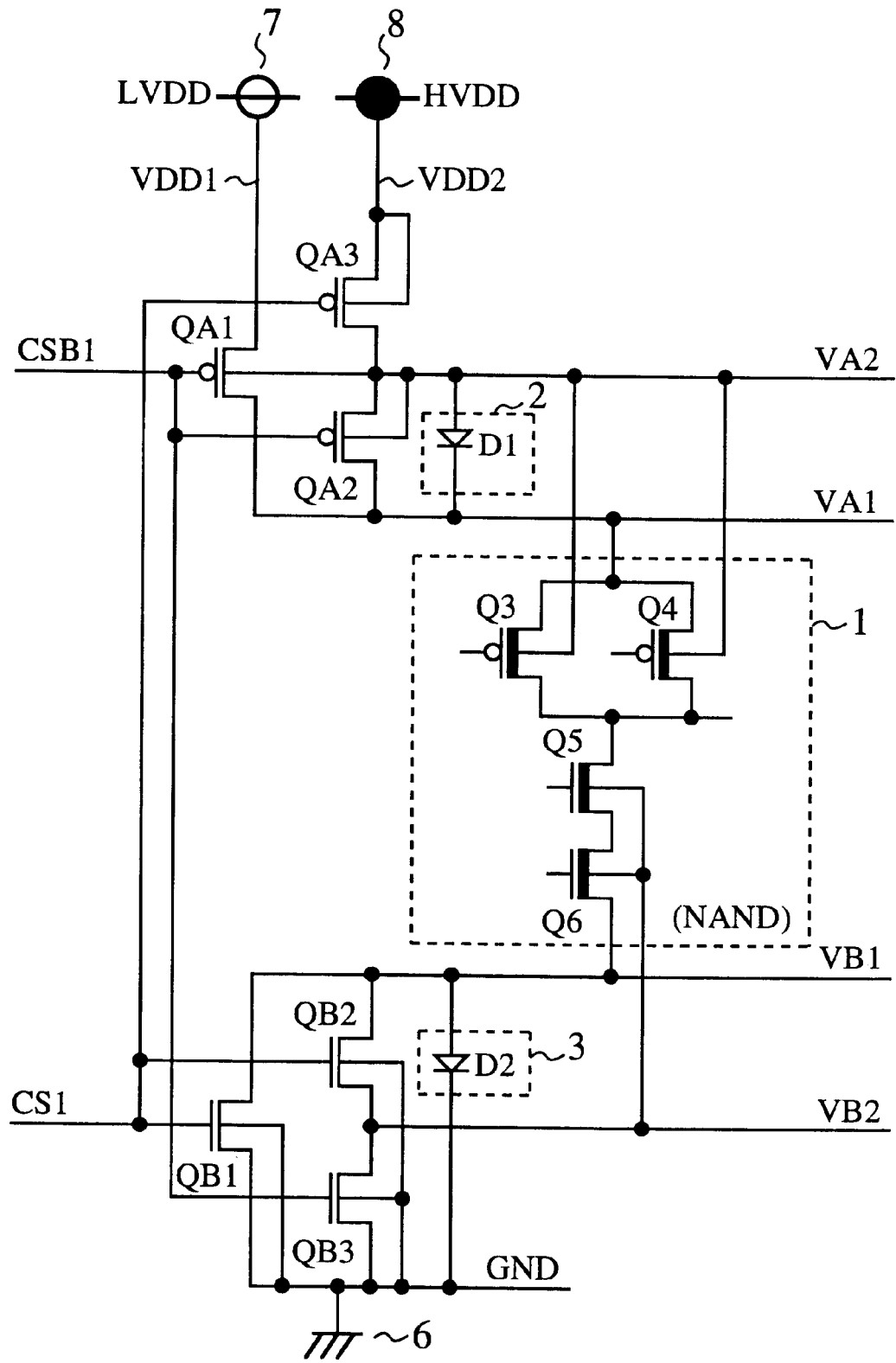
FIG. 4 is a schematic circuit diagram showing a semiconductor integrated circuit according to a second embodiment of the present invention.

Referring to FIG. 4, there is illustrated a schematic circuit diagram showing a semiconductor integrated circuit according to a second embodiment of the present invention. As only the constructions different from FIG. 1 will be described, the semiconductor integrated circuit has two power supply pins 7, 8, provided independently, in which a low voltage LVDD and a high voltage HVDD are supplied from the outside of a semiconductor chip, respectively. One source/drain electrode of a pMOS transistor QA1 is connected to a power supply pin 7 via a power supply line VDD1, while one source/drain electrode of a pMOS transistor QA3 is connected to an external power supply pin 8 via a power supply line VDD2. Irrespective of an active or sleep period, the low voltage LVDD and the high voltage HVDD are applied to the pMOS transistors QA1, QA3 simultaneously. A potential generation circuit 2 includes a diode D1 in which an anode and a cathode are connected to a backgate power supply line VA2 and a virtual power supply line VA1, respectively.

Each backgate electrode of the pMOS transistors QA1, QA2 is connected to the backgate power supply line VA2. Though the pMOS transistors QA1, QA2 are biased from each source/drain electrode to the corresponding backgate electrode in the forward direction, there is no occurrence of a potential difference so that the source/drain electrode and the backgate electrode are electrically conducted.

ON/OFF operations of the transistors QA1 to QA3 during the active and sleep periods are similar to those of the first embodiment.

During the active period, voltage values supplied to the virtual power supply lines VA1, VB1 and the backgate power supply lines VA2, VB2 are the same as those of the embodiment 1.

During the sleep period, there occurs a voltage drop from the power supply line VDD2 in the backgate power supply line VA2 because of an ON-state resistance of the pMOS transistor QA3, and the backgate power supply line VA2 has a voltage of (HVDD−ΔVA3). On the other hand, there occurs a further voltage drop from the backgate power supply line VA2 in the virtual power supply line VA1 because of the diode D1, and the virtual power supply line VA1 has a value of (HVDD−ΔVA3−V1). Thus, the backgate power supply line VA2 is higher in voltage than the virtual power supply line VA1 by V1.

According to the semiconductor integrated circuit of the present embodiment 2, also, since during the active period, the backgate potential to each source potential of the pMOS transistors Q3, Q4 in the internal circuit 1 is lowered, the current supply ability of the pMOS transistors Q3, Q4 may be improved. Further, since the backgate potential to each source potential in the nMOS transistors Q5, Q6 is enhanced, the current supply ability of the nMOS transistors Q5, Q6 may be improved. Therefore, the operation speed of the whole internal circuit 1 may be improved.

On the other hand, during the sleep period, to the contrary, since the backgate potential of the pMOS transistors Q3, Q4 to the corresponding source potential is enhanced, leakage currents caused in the pMOS transistors Q3, Q4 may be suppressed. Since the backgate potential of the nMOS transistors Q5, Q6 to the corresponding source potential is lowered, leakage currents caused in the nMOS transistors Q5, Q6 may also be suppressed.

Further, when the internal circuit 1 has a sequential circuit, a voltage of (HVDD−ΔVA3−V1−V2) is generated between the virtual power supply lien VA1, VB1. Accordingly, even during the sleep period, the latched data in the sequential circuit does not disappear on completion of the active period due to that voltage.

Additionally, in the present second embodiment, since the low voltage LVDD to be supplied to the pMOS transistor QA1 during the active period, and the high voltage HVDD to be supplied to the pMOS transistor QA3 during the sleep period are supplied from the external power supply pins different respectively, a circuit having a voltage converting function (voltage switching circuit 4) is not required.

Typically on a single semiconductor chip formed with the above semiconductor integrated circuit, in addition to power supply pins 7, 8, formed are a plurality of external pins as signal pins for transmitting/receiving external signals, and a plurality of I/O buffer circuits connected between the plurality of external pins and the semiconductor integrated circuit. Since each of the I/O buffer circuits furnishes a signal received at the external pin to the semiconductor integrated circuit, or transmits a signal from the semiconductor integrated circuit to the external pin, a great driving ability would be required for transmission/reception with the external. The power supply pin 8 is connected to each I/O buffer, and supplies the high voltage HVDD in addition to the pMOS transistor QA3 as an activation power source of each I/O buffer circuit.

On the other hand, when there is provided on the semiconductor chip with only power supply lines supplying one single power supply voltage of either of the low voltage LVDD and the high voltage HVDD in addition to a power source pin for receiving a ground voltage, a circuit which generates the other power supply voltage will be required. In the case, a DC—DC converter (voltage converter) described in the above-mentioned JP-A 11/214962 is connected between the power supply lines VDD1, VDD2. When only the high voltage HVDD is externally inputted, a voltage converter for converting the high voltage HVDD to the low voltage LVDD is provided, and the low voltage LVDD outputted from the voltage converter is supplied to the pMOS transistor QA1. On the other hand, when only the low voltage LVDD is externally inputted, another voltage converter for converting the low voltage LVDD to the high voltage HVDD, and the high voltage HVDD outputted from the voltage converter is supplied to the pMOS transistor QA3.

Alternatively, in FIG. 3, the pMOS transistor QA1 may have a low threshold voltage equal to or around the pMOS transistors Q3, Q4 in the internal circuit 1. Additionally, each backgate electrode of the pMOS transistors QA1, QA2 may be connected to the power supply line VDD2 to receive the high voltage HVDD.

Third Embodiment

Figure 5:
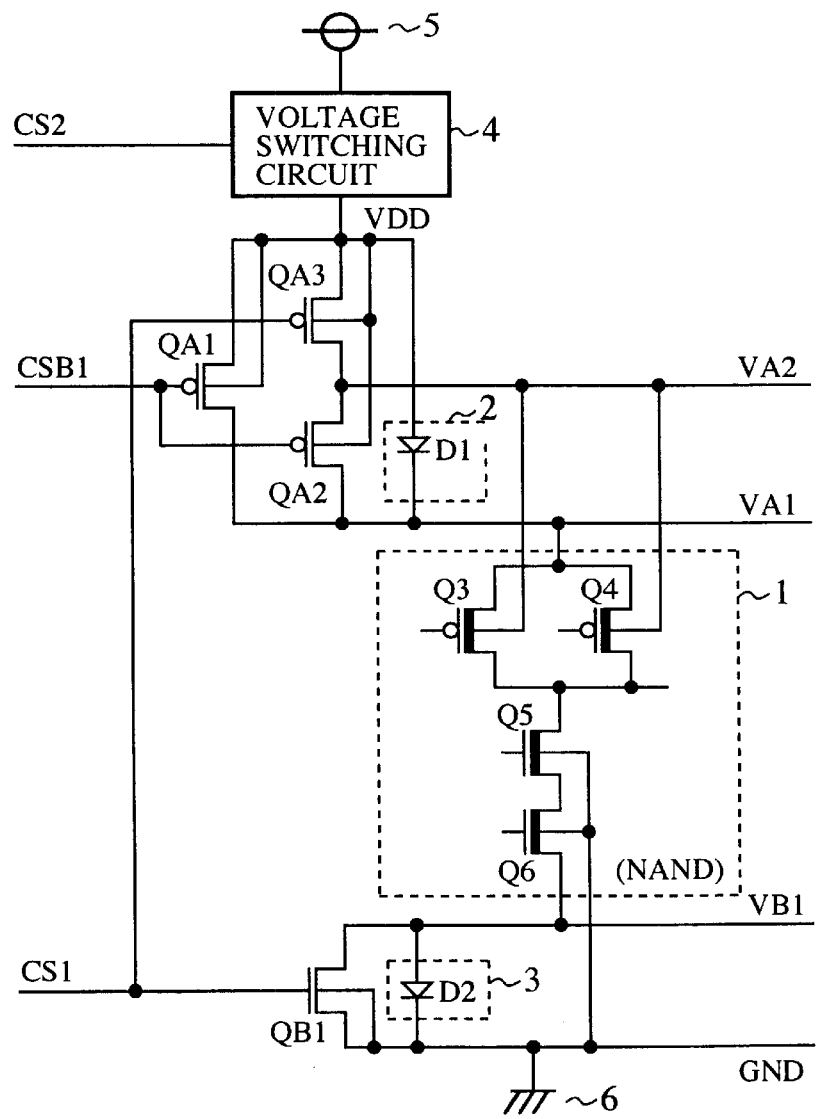
FIG. 5 is a schematic circuit diagram showing a semiconductor integrated circuit according to a third embodiment of the present invention.

Referring to FIG. 5, there is illustrated a circuit diagram showing a semiconductor integrated circuit according to a third embodiment of the present invention. Only the constructions different from FIG. 1 will be described.

The semiconductor integrated circuit receives a ground potential 0 V by connecting each backgate electrode of nMOS transistors Q5, Q6 in an internal circuit 1 to a power supply line GND. There is no existence of the nMOS transistors QB2, QB3 and the backgate power supply line VB2 in FIG. 1.

The operation of the semiconductor integrated circuit of FIG. 5 will be described in view of only the points different, from FIG. 1.

Figure 11:
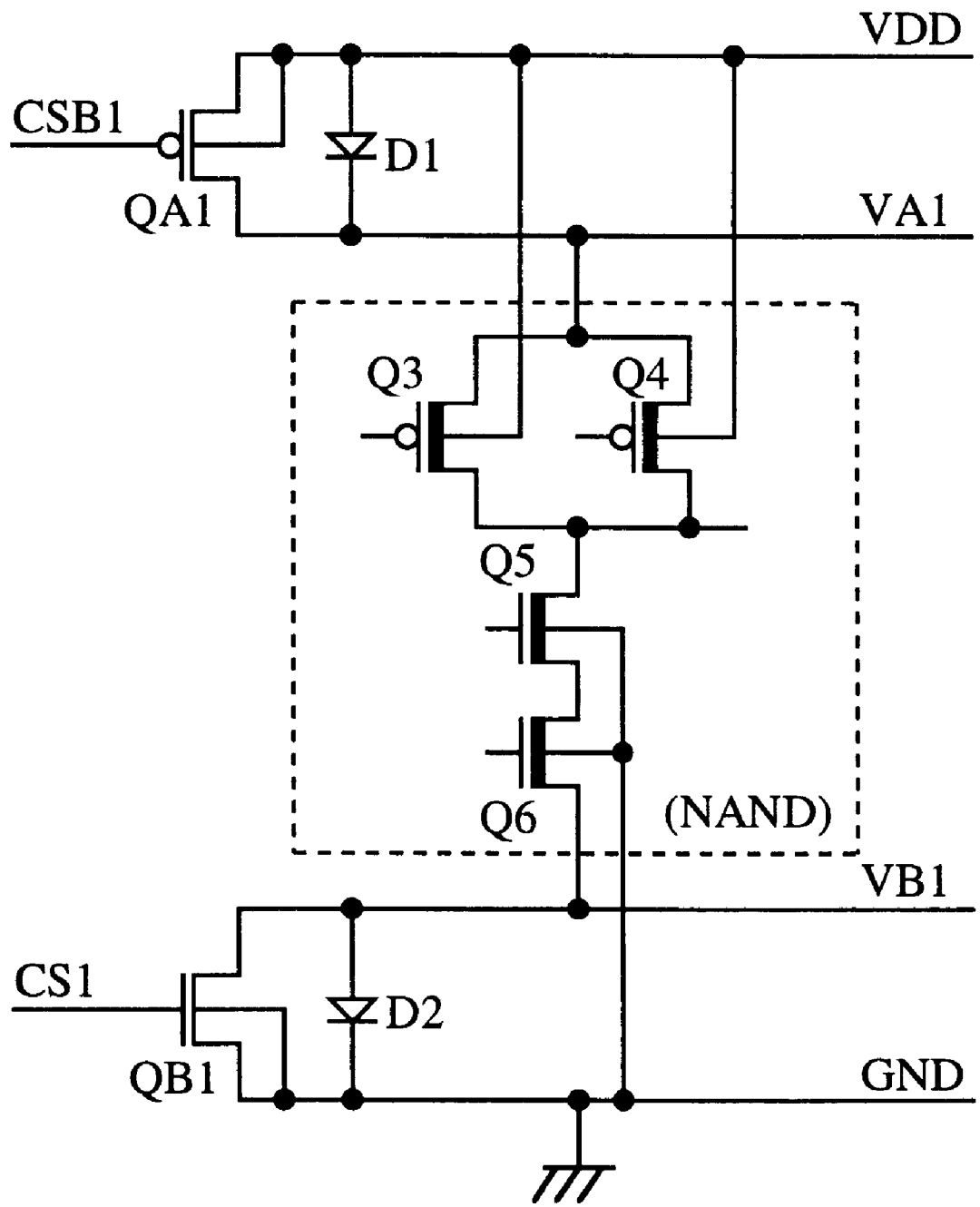
FIG. 11 is a circuit diagram showing a semiconductor integrated circuit according to the prior art.
Figure 12:
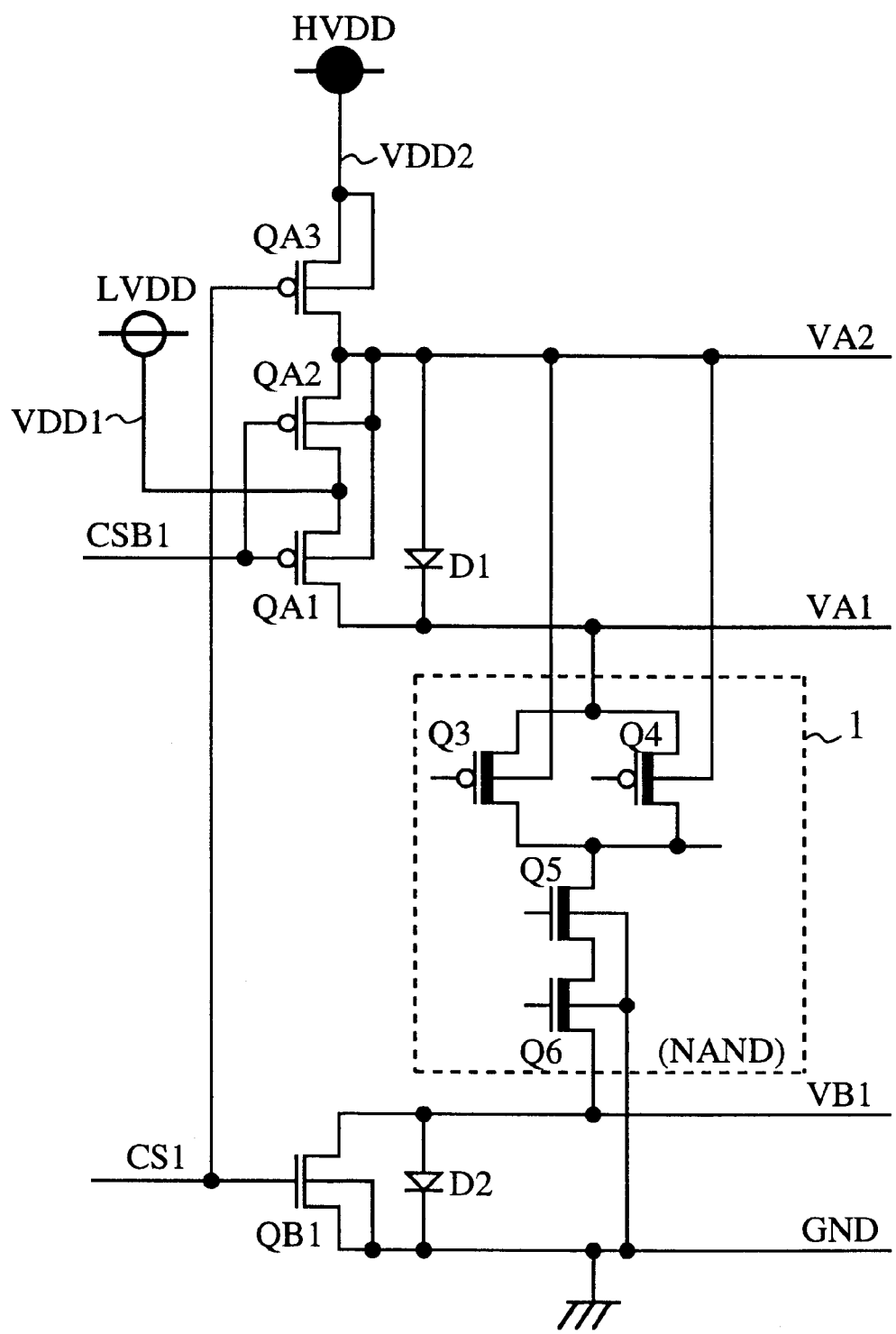
FIG. 12 is a circuit diagram showing another semiconductor integrated circuit according to the prior art.

When the internal circuit 1 is in an active period, the nMOS transistor QB1 is conducted. There occurs a voltage enhancement of a virtual power supply line VB1 to a power supply line GND because of the ON-state resistance of the nMOS transistor QB1, and a voltage of ΔVB1 is supplied to the virtual power supply line VB1. The backgate potential of the nMOS transistors Q5, Q6 to the corresponding source potential is enhanced to bring the transistors Q5, Q6 into a reverse-bias state. Thus, the operation speeds of the nMOS transistors Q5, Q6 are the same as those of FIGS. 11, 12 in the prior art, while the operation speeds of the pMOS transistors Q3, Q4 are the same as that of FIG. 1.

When the internal circuit 1 is in a sleep period, the nMOS transistor QB1 becomes non-conductive, and thereby the virtual power supply line VB1 has a potential of V2 due to the diode D2. Therefore, the potential of the virtual power supply line VB1 during the sleep period is equivalent to that of FIG. 1, thereby suppressing the leakage current caused in the internal circuit 1 during the sleep period.

In addition, it is generally known that the carrier mobility of pMOS transistors is smaller than that of nMOS transistors. To enhance the operation speed of a whole CMOS structure circuit, it is required to enhance the operation speed of pMOS transistors more than nMOS transistors.

As shown in the semiconductor integrated circuit of the present third embodiment, it is effective for improvement of a general operation performance of the internal circuit 1 to increase the operation speed of only the pMOS transistors Q3, Q4 as the operation speed of the nMOS transistors Q5, Q6 remains the prior art.

Figure 6:
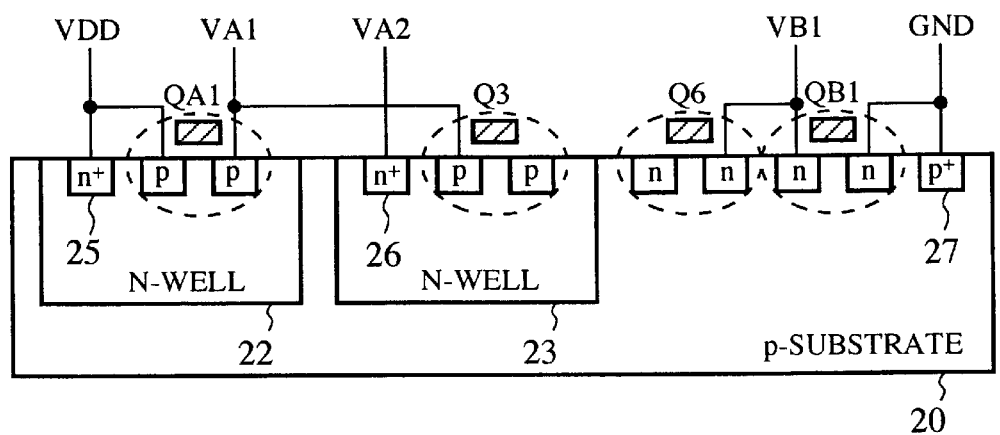
FIG. 6 is a sectional view showing schematically one example when the semiconductor integrated circuit of FIG. 5 is formed on a p-type semiconductor substrate.

FIG. 6 is a schematic sectional view showing one example of a structure when the semiconductor integrated circuit of FIG. 5 is formed on a p-type semiconductor substrate.

N-wells 22, 23 is formed on a p-type semiconductor substrate 20, spaced apart from each other, to be electrically separated from each other. PMOS transistors QA1 to QA3 are formed on the N-well 22 (QA1 only depicted in FIG. 6). PMOS transistors Q3, Q4 are formed on the N-well 23 (Q3 only depicted in FIG. 6). Each of the pMOS transistors Q3, QA1 includes two p-type semiconductor layers serving as two source/drain regions, formed on the N-well. The N-well 22 is connected to the power supply line VDD via the n+ semiconductor layer 25, while the N-well 23 is connected to the backgate power supply line VA2 via the n+ semiconductor layer 26.

On the other hand, all the nMOS transistors QB1, Q5, Q6 are formed on the p-type semiconductor substrate 20 (transistor Q6 not depicted in FIG. 6). Each of the nMOS transistors includes two n-type semiconductor layers serving as two source/drain regions, formed on the p-type substrate 20. The power supply line GND is connected to the substrate 20 via the p+ semiconductor layer 27.

When the semiconductor integrated circuit of FIG. 1 is formed on the p-type semiconductor substrate, the backgate electrodes of the nMOS transistors QB1 to QB3 and the backgate electrodes of the nMOS transistors Q5, Q6 have to be electrically separated from each other. Thus, the semiconductor integrated circuit has to be formed by employing a so-called triple well structure, such that an N-well is formed on a p-type semiconductor substrate, and that a P-well is further formed in the N-well.

However, according to the present third embodiment, as is apparent from FIG. 6, the semiconductor integrated circuit may be formed without provision of the triple well on the p-type semiconductor substrate, thereby holding down costs of wafer processes.

Fourth Embodiment

Figure 7:
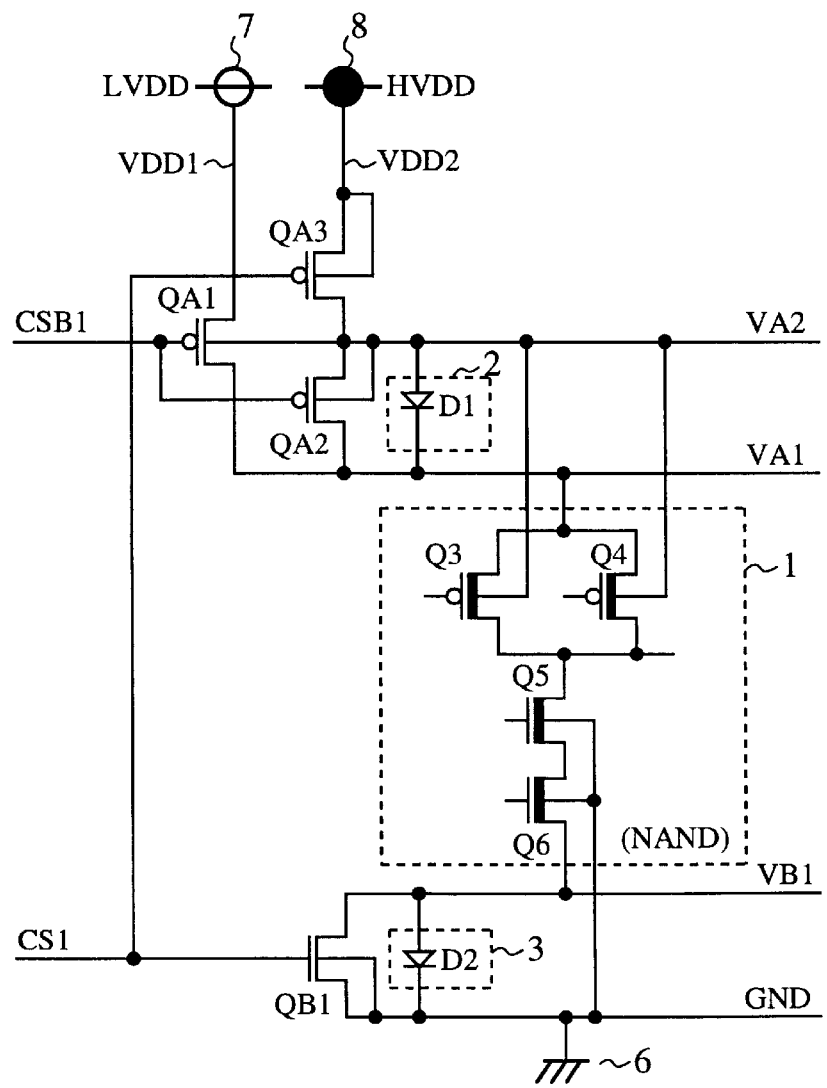
FIG. 7 is a schematic circuit diagram showing a semiconductor integrated circuit according to a fourth embodiment of the present invention.

FIG. 7 is a circuit diagram showing a semiconductor integrated circuit according to a fourth embodiment. Only the constructions different from FIG. 4 will be described.

In the semiconductor integrated circuit, each backgate electrode of nMOS transistors Q5, Q6 of an internal circuit 1 is connected to a power supply line GND, and receives a ground potential 0 V. However, there is no existence of the nMOS transistors QB2, QB3 and the backgate power supply line VB2 of FIG. 4 in the circuit.

The ON/OFF operations of transistors QA1–QA3 and QB1 are the same as those of FIG. 6. The voltages of a virtual power supply line VA1 and a backgate power supply line VA2 in active and sleep periods are the same as those of FIG. 4, and the voltage of a virtual power supply line VB1 in the active and sleep periods the same as those of FIG. 6.

Accordingly, according to the present fourth embodiment as well, the operation speed of the internal circuit 1 may be improved in the active period, and the leakage current caused in the internal circuit 1 may be suppressed in the sleep period. In this case, since the number of these transistors is not changed as compared to the prior art circuit shown in FIG. 12, there is no increase in circuit scale.

As in the third embodiment, since the backgate electrodes of all the nMOS transistors Q5, Q6 in the internal circuit 1 and the backgate electrode of the nMOS transistor QB1 are connected to a common power supply line GND, there is no need to provide a triple well structure when the semiconductor integrated circuit is formed on a p-type semiconductor substrate, thereby suppressing costs of wafer processes.

Fifth Embodiment

Figure 8A:
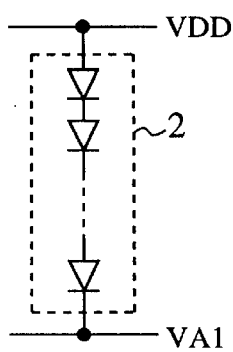
FIGS. 8A, 8B are circuit diagrams showing potential generation circuits 2, 3 in a fifth embodiment of the present invention.

In the first to fourth embodiments, as shown in FIG. 8A, a potential generation circuit 2 may be constructed by a plurality of diodes connected in series between a power supply line VDD (or backgate power supply line VA2) and a virtual power supply line VA1. The anode of each diode is connected to the side of the power supply line VDD (or backgate power supply line VA2), and the cathode connected to the side of the virtual power supply line VA1. In a sleep period, each diode is biased in the forward direction, causing a voltage drop by its threshold voltage.

Figure 8B:
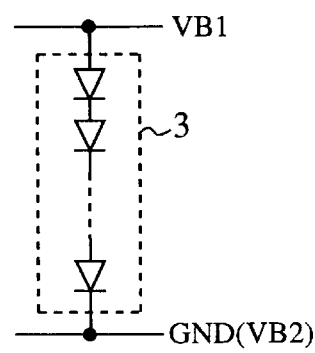

As shown in FIG. 8B, a potential generation circuit 3 may be constructed by a plurality of diodes connected in series between a virtual power supply line VB1 and a power supply line GND (or backgate power supply line VB2). The anode of each diode is connected to the side of the virtual power supply line VB1, and the cathode connected to the side of the power supply line GND (or backgate power supply line VB2). In a sleep period, each diode is biased in the forward direction, causing a voltage drop by its threshold voltage.

Sixth Embodiment

Figure 9A:
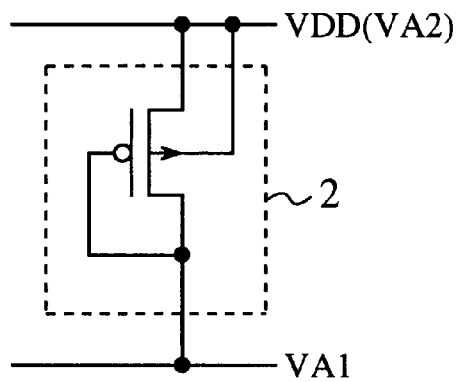
FIGS. 9A, 9B are circuit diagrams showing potential generation circuits 2, 3 in a sixth embodiment of the present invention.

In the first to fourth embodiments, as described in FIG. 9A, a potential generation circuit 2 is constructed by a pMOS transistor in which one source/drain electrode is connected to a power supply line VDD (or backgate power supply line VA2), which the other source/drain electrode is connected to a virtual power supply line VA1, which the gate electrode is connected to the other source/drain electrode, and which a backgate electrode is connected to the power supply line VDD (or backgate power supply line VA2). Thus, in a sleep period, there occurs a voltage drop from the power supply line VDD (or backgate power supply line VA2) to the virtual power supply line VA1 by a threshold voltage of the pMOS transistor.

Figure 9B:
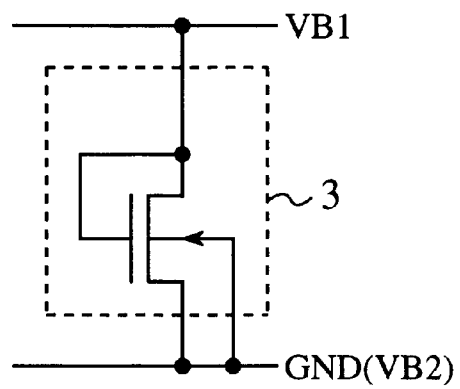

In addition, as shown in FIG. 9B, a potential generation circuit 3 is constructed by a nMOS transistor in which one source/drain electrode is connected to a virtual power supply line VB1, which the other source/drain electrode is connected to a power supply line GND (or backgate power supply line VB2), which the gate electrode is connected to the one source/drain electrode, and which the backgate electrode is connected to the power supply lien GND (or backgate power supply line VB2). Thus, in a sleep period, there occurs a voltage enhancement from the power supply line GND to the virtual power supply line VB1 by the threshold voltage of the nMOS transistor.

Seventh Embodiment

Figure 10A:
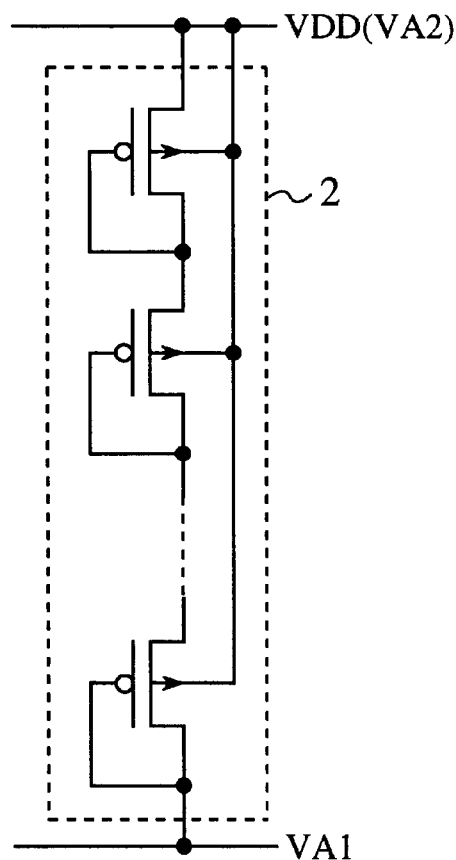
FIGS. 10A, 10B are circuit diagrams showing potential generation circuits 2, 3 in a seventh embodiment of the present invention.

In the first to fourth embodiments, as shown in FIG. 10A, a potential generation circuit 2 is constructed by a plurality of pMOS transistors which are connected in series between a power supply line VDD (or backgate power supply line VA2) and a virtual power supply line VA1, and each of which the gate electrode is connected to one source/drain electrode expected as a drain, and the backgate electrode is connected to the power supply line VDD (or backgate power supply line VA2). The source of each pMOS transistor is connected to the side of the power supply line VDD (or backgate power supply line VA2) and the drain connected to the side of the virtual power supply line VA1. Since there arises a voltage drop from source to drain by a threshold voltage of each transistor in a sleep period, the amount of voltage drops from the power supply line VDD (or backgate power supply line VA2) to the virtual power supply line VA1 becomes the sum of the threshold voltages of the pMOS transistors.

Then, when one or more transistors of the plurality of pMOS transistors make differences in threshold voltage from the rest of the transistors, the amount of the voltage drops from the power supply line VDD (or backgate power supply line VA2) to the virtual power supply line VA1 may be adjusted to a desired value.

Figure 10B:
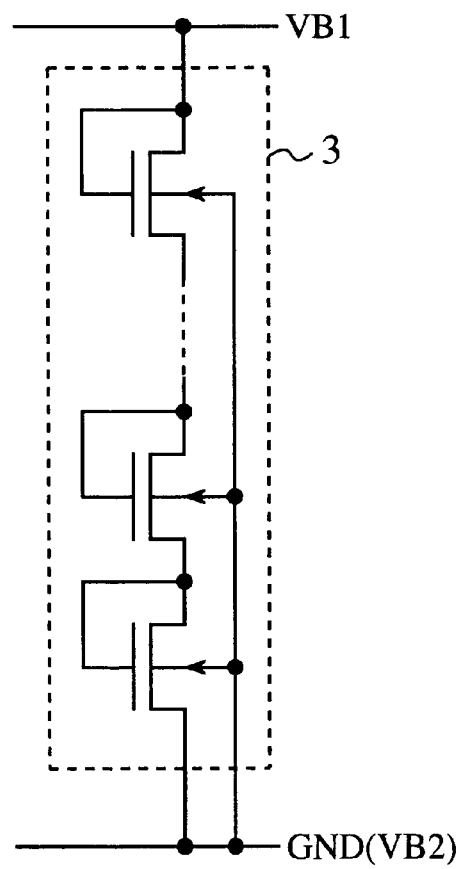

Further, as shown in FIG. 10B, a potential generation circuit 3 may be constructed by a plurality of nMOS transistors which are connected in series between a virtual power supply line VB1 and a power supply line GND (or backgate power supply line VB2), and each of which the gate electrode is connected to one source/drain electrode expected as drain and the backgate electrode is connected to the power supply line GND (or backgate power supply line VB2). The drain of each nMOS transistor is connected to the side of the virtual power supply line VB1 and the source connected to the side of the power supply line GND (or backgate power supply line VB2). Since there occurs a voltage drop from drain to source by a threshold voltage of each transistor, the amount of voltage drops from the virtual power supply line VB1 to the power supply line GND (or backgate power supply line VB2) corresponds to the sum of the threshold voltages of the nMOS transistors.

Then, when one or more transistors of the plurality of nMOS transistors constituting the potential generation circuits 3 make differences in threshold voltage from the rest of the transistors, the amount of the voltage drops from the virtual power supply line VB1 to the power supply line GND (or backgate power supply line VB2) may be adjusted to a desired value.

Eighth Embodiment

In the first to fourth embodiments, even if the source/drain electrodes and backgate electrodes of nMOS transistors of an internal circuit 1 are directly connected to a power supply line GND without inserting any MOS transistors and diodes between an internal circuit 1 and a power supply line GND to reduce circuit elements or components, the operation of pMOS transistors Q3, Q4 becomes faster, thereby improving the operation speed of the internal circuit 1 in an active period.

Ninth Embodiment

Either or both of pMOS transistors QA1, QA2 may be substituted by an nMOS transistor of which both the source/drain electrodes are connected to the same place and the backgate electrode is connected to a power supply electrode line GND or a backgate power supply line VB2. At the time, a control signal which becomes H level in an active period and L level in a sleep period is supplied to the gate electrode of the nMOS transistor. However, a voltage higher than a low voltage LVDD as the H level, preferably at least a voltage of (LVDD+Vth) has to be employed, where the Vth is a threshold voltage of the nMOS transistor. This is to control a potential drop due to ensure the gate voltage in an ON-state of the nMOS transistor.

For example, in the second, fourth embodiments, a high voltage HVDD to be supplied to the power supply pin 8 may be used as H level of the control signal to be supplied to the gate electrode of the nMOS transistor. On the other hand, in the first, third embodiments, when the low voltage LVDD is supplied to the power supply pin 5, a voltage conversion circuit for converting the low voltage LVDD to the high voltage HVDD is provided in the power supply switching circuit 4, and the high voltage HVDD outputted from the voltage conversion circuit is used as H level of the control signal in an active period, and this may be supplied to the power supply line VDD in a sleep period.

As described above, a semiconductor integrated circuit of the present invention comprises: a first field effect transistor including one source/drain electrode for receiving a power supply voltage, the other source/drain electrode connected to a virtual power supply line, and a gate electrode for receiving a control signal so as to control ON/OFF; and a second field effect transistor, including one source/drain electrode connected to the virtual power supply line, and the other source/drain electrode connected to a backgate power supply line, for conducting when the first transistor conducts, wherein one source/drain electrode of a third field effect transistor constructing an internal circuit is connected to the virtual power supply line and the backgate electrode is connected to the backgate power supply line. Thus, because of an ON-resistance of the second field effect transistor and so on, there occurs a voltage drop of the backgate power supply line to the first virtual power supply line, and the absolute value of the threshold voltage of the third field effect transistor is reduced because of the forward bias state, resulting in accelerating the operation of the third transistor. Therefore, when the internal circuit of the semiconductor integrated circuit is turned on to be active, the operation speed of the internal circuit constructed with the third field effect transistor may be improved.

What is claimed is:

1. A semiconductor integrated circuit comprising:
a first virtual power supply line;
first backgate power supply line;
power supply switch circuitry at least including
a first field effect transistor including one source/drain electrode for receiving a first power supply voltage, the other source/drain electrode connected to said first virtual power supply line, and a gate electrode for receiving a control signal for controlling ON/OFF of said transistor, and
a second field effect transistor, having one source/drain electrode connected to said first virtual power supply line and the other source/drain electrode connected to said first backgate power supply line, to be turned on when said first field effect transistor is turned on; and
circuitry including a third field effect transistor having one source/drain electrode connected to said first virtual power supply line and a backgate electrode connected to said first backgate power supply line wherein said first field effect transistor and said second field effect transistor are connected in series between a node for receiving said first power supply voltage and said first backgate power supply line.

2. A semiconductor integrated circuit according to claim 1, wherein said third field effect transistor is p-channel type, and further comprising:
a fourth field effect transistor having one source/drain electrode for receiving a second power supply voltage, the other source/drain electrode connected to said first backgate power supply line, and a gate electrode for receiving a control signal so as to be turned on complimentarily with said first field effect transistor; and a potential generation circuit, connected to said first virtual power supply line, for generating a potential smaller than that of said first backgate power supply line on said first virtual power supply line when said first field effect transistor is turned off, wherein said second field effect transistor has a gate electrode for receiving a control signal so as to be turned on complimentarily with said fourth field effect transistor.

3. A semiconductor integrated circuit according to claim 2, wherein at least either of backgate electrodes of said first field effect transistor and said second field effect transistor is connected to said first backgate power supply line.

4. A semiconductor integrated circuit according to claim 2, further comprising a first power supply line connected to one source/drain electrode of said first field effect transistor and one source/drain electrode of said fourth field effect transistor, and supplying to the respective source/drain electrodes a first voltage as said first and second power supply voltages when said first field effect transistor is turned on, and a second voltage having a voltage value higher than the first voltage as said first and second power supply voltages when said first field effect transistor is turned off.

5. A semiconductor integrated circuit according to claim 4, wherein the supplies of said first and second voltages to said first power supply line are performed by a voltage switching circuit.

6. A semiconductor integrated circuit according to claim 2, further comprising:

a first power supply line for supplying a first voltage as said first power supply voltage to one source/drain electrode of said first field effect transistor; and a second power supply line for supplying a second voltage having a voltage value higher than that of said first voltage as said second power supply voltage to one source/drain electrode of said fourth field effect transistor, wherein said first and second voltages are supplied to said first and fourth field effect transistors simultaneously.

7. A semiconductor integrated circuit according to claim 6, wherein the backgate electrodes of said first and second field effect transistors are connected to said first backgate power supply line.

8. A semiconductor integrated circuit according to claim 1, wherein said third field effect transistor is n-channel type, and further comprising:

a fourth field effect transistor having one source/drain electrode for receiving a second power supply voltage, the other source/drain electrode connected to said first backgate power supply line, and a gate electrode for receiving a control signal so as to be turned on complimentarily with said first field effect transistor; and a potential generation circuit, connected to said first virtual power supply line, for generating a potential larger than that of said first backgate power supply line on said first virtual power supply line when said first field effect transistor is turned off, wherein said second field effect transistor has a gate electrode for receiving a control signal so as to be turned on complimentarily with said fourth field effect transistor.

9. A semiconductor integrated circuit according to claim 4, wherein the backgate electrodes of said first, second, and fourth field effect transistors are connected to said first backgate power supply line.

10. A semiconductor integrated circuit according to claim 1, further comprising:

a second virtual power supply line;

a power supply line;

said power supply switch circuitry at least further including a fifth field effect transistor having one source/drain electrode connected to said power supply line, the other source/drain electrode connected to said second virtual power supply line, a gate electrode for receiving another control signal so as to control ON/OFF of said transistor, and a backgate electrode connected to said second power supply line; and a sixth field effect transistor having one source/drain electrode connected to said second virtual power supply line, and a backgate electrode connected to said power supply line, and which is different in conductance type from said third field effect transistor and which constructs an internal circuit of CMOS type with said third field effect transistor.

11. A semiconductor integrated circuit according to claim 10, further comprising:

a potential generation circuit, connected to said second virtual power supply line, for generating a potential difference between said power supply line and said second virtual power supply line when said fifth field effect transistor is turned off.

12. A semiconductor integrated circuit according to claim 2, wherein said potential generation circuit includes a construction such that one diode or a plurality of diodes connected in series are connected between said backgate power supply line and said first virtual power supply line.

13. A semiconductor integrated circuit according to claim 2, wherein said potential generation circuit includes a construction such that one field effect transistor or a plurality of field effect transistors connected in series are connected between said backgate power supply line and said first virtual power supply line, and the gate electrode and one source/drain electrode of each field effect transistor in said first potential generation circuit is connected to each other.

14. A semiconductor integrated circuit according to claim 4, wherein said potential generation circuit includes a construction such that one diode or a plurality of diodes connected in series are connected between said first power supply line and a second virtual power supply line.

15. A semiconductor integrated circuit according to claim 4, wherein said potential generation circuit includes a construction such that one field effect transistor or a plurality of field effect transistors connected in series are connected between said first power supply line and a second virtual power supply line, and the gate electrode and one source/drain electrode of each field effect transistor in said potential generation circuit is connected to each other.

16. A semiconductor integrated circuit according to claim 8, wherein said potential generation circuit includes a construction such that one diode or a plurality of diodes connected in series are connected between said backgate power supply line and said first virtual power supply line.

17. A semiconductor integrated circuit according to claim 8, wherein said potential generation circuit includes a construction such that one field effect transistor or a plurality of field effect transistors connected in series are connected between said backgate power supply line and said first virtual power supply line, and the gate electrode and one source/drain electrode of each field effect transistor in said first potential generation circuit is connected to each other.

18. A semiconductor integrated circuit according to claim 8, wherein said potential generation circuit includes a construction such that one diode or a plurality of diodes connected in series are connected between a second power supply line and said second virtual power supply line.

19. A semiconductor integrated circuit according to claim 8, wherein said potential generation circuit includes a construction such that one field effect transistor or a plurality of field effect transistors connected in series are connected between said first power supply line and a second virtual power supply line, and the gate electrode and one source/drain electrode of each field effect transistor in said second potential generation circuit is connected to each other.

20. A semiconductor integrated circuit according to claim 8, wherein the backgate electrodes of said first, second, and fourth field effect transistors are connected to said first backgate power supply line.

21. A semiconductor integrated circuit according to claim 1, further comprising:

a fourth field effect transistor having one source/drain electrode for receiving a second power supply voltage, the other source/drain electrode connected to said first backgate power supply line, and a gate electrode for receiving a control signal so as to be turned on complimentarily with said first field effect transistor; and a potential generating circuit connected to said first virtual power supply line, for generating a potential difference between said first backgate power supply line and said first virtual power supply line when said first field effect transistor is turned off, wherein said second field effect transistor has a gate electrode for receiving a control signal so as to be turned on complimentarily with said fourth field effect transistor.

22. A semiconductor integrated circuit according to claim 21, wherein said first power supply voltage has a first voltage value when said first field effect transistor is turned on, and said second power supply voltage has a second voltage value different from said first voltage value when said first field effect transistor is turned off.

23. A semiconductor integrated circuit according to claim 22, wherein at least either of backgate electrodes of said first field effect transistor and said second field effect transistor is connected to said first backgate power supply line.

* * * * *